United States Patent [19]
Ho et al.

[11] Patent Number: 5,293,057
[45] Date of Patent: Mar. 8, 1994

[54] ELECTROSTATIC DISCHARGE PROTECTION CIRCUIT FOR SEMICONDUCTOR DEVICE

[75] Inventors: Fan Ho; Mitchel A. Daher, both of Boise, Id.

[73] Assignee: Micron Technology, Inc., Boise, Id.

[21] Appl. No.: 929,818

[22] Filed: Aug. 14, 1992

[51] Int. Cl.$^5$ .................................... H01L 29/72
[52] U.S. Cl. .................................... 257/356; 257/361; 257/362; 257/363
[58] Field of Search ............... 257/355, 356, 362, 361, 257/357, 358, 359, 363

[56] References Cited

U.S. PATENT DOCUMENTS

| | | | |
|---|---|---|---|
| 4,692,781 | 9/1987 | Rountree et al. | 357/23.13 |
| 4,924,339 | 5/1990 | Atsumi et al. | 257/362 X |
| 4,994,874 | 2/1991 | Shimizu et al. | 257/362 |
| 5,043,782 | 8/1991 | Avery | 257/362 |
| 5,218,222 | 6/1993 | Roberts | 257/362 |

FOREIGN PATENT DOCUMENTS

| | | | |
|---|---|---|---|
| 1-262655 | 10/1989 | Japan | 257/362 |
| 2-214164 | 8/1990 | Japan | 257/362 |

*Primary Examiner*—William Mintel
*Attorney, Agent, or Firm*—Stoel Rives Boley Jones & Grey

[57] ABSTRACT

An ESD protection circuit (38) for a MOS device uses at least one electrically floating-base N+P−N+ transistor (43) connected between a metal bonding pad (40) and ground. The electrically floating base region (44) of each transistor is formed by a thin oxide region deposited over a substrate (50) of the MOS device. Because its N+ regions (42, 45) are made symmetrical about the floating base, each transistor conducts ESD pulses of both polarities equally. The beta of each transistor is made sufficiently large to withstand short-duration ESD current spikes. Current density is minimized by diffusing a deep N− well (54, 56) into each N+ region of each transistor to provide a larger effective conducting area. Low capacitance and higher breakdown voltage are achieved by eliminating the gate structure of prior art FET-based protection circuits.

10 Claims, 2 Drawing Sheets

ELECTROSTATIC DISCHARGE PROTECTION CIRCUIT FOR SEMICONDUCTOR DEVICE

TECHNICAL FIELD

This invention relates to semiconductor devices, and more particularly, to an electrostatic discharge ("ESD") protection circuit fabricated at interconnection bonding pads of such devices.

BACKGROUND OF THE INVENTION

There have been previously known apparatus and methods for fabricating circuits at the interconnection bonding pads of metal-oxide semiconductor ("MOS") devices to prevent damage to internal circuitry caused by ESD pulses.

One such circuit is described in U.S. Pat. No. 4,692,781 of Roundtree et al. FIGS. 1 and 2 hereof show and assist in the explanation of the operation of the Roundtree et al. prior art ESD protection circuit for a MOS device. With reference to FIG. 1, a metal bonding pad 10 is electrically connected by a metal conductor 11 to a drain 12 of a field-effect transistor ("FET") 13. FET 13 has a gate 14 electrically connected to drain 12 and a source 15 electrically connected to a substrate 16. When the voltage present at pad 10 is a positive threshold voltage exceeding about +20 to +25 volts with respect to substrate 16, FET 13 enters secondary breakdown and conducts heavily to substrate 16. When the voltage present at pad 10 is negative with respect to the voltage of substrate 16, substrate 16 and drain 12 act as a forward-biased diode and conduct current from substrate 16 into pad 10. Drain 12 of FET 13 is also connected to one end of a resistor 17, formed by a resistive interconnect path. The other end of resistor 17 is connected to a drain 18 of a MOS transistor 19 that functions as a diode. A source 20 and a gate 21 of MOS transistor 19 are connected to substrate 16 at respective metal-to-silicon contacts 22 and 23. Together, resistor 17 and transistor 19 act as an isolation stage between pad 10 and the internal circuitry of the MOS device. Drain 18 is connected to the internal circuitry of the MOS device (for example an address buffer) at a metal-to-silicon contact 24.

FIG. 2 schematically illustrates the structure of FET 13 and shows a thick field oxide 26 beneath gate 14. Field oxide 26 is subject to voltage breakdown of about 50 volts and adds capacitance at metal bonding pad 10. When FET 13 heavily conducts electrical current in response to an ESD pulse, most of the current flows in a channel 28 and thereby causes excessive heating in the region between channel 28 and source 15. Excessive current flow in drain 12 can cause "contact spiking" damage between a contact 30 and a substrate 32. The highest voltage levels such protection circuits withstand is about 7 to 8 kilovolts. However, such prior art ESD protection circuits have different conduction mechanisms for protecting against positive and negative ESD pulses resulting in better protection against negative ESD pulses than positive ESD pulses. Therefore, an ESD protection circuit rated at "8 kilovolts" may actually protect against positive ESD pulses of only 1 kilovolt or less.

Most MOS devices with this degree of voltage protection are not usually damaged by routine handling, but the trend toward smaller device geometries has made some MOS devices more susceptible to damage caused by ESD voltage and current. Smaller device geometries also result in lower device capacitances to allow higher device switching speeds. Prior art ESD protection circuits have a relatively high capacitance that limits the speed capability of small geometry MOS devices.

In response to such trends, ESD protection standards have evolved that dictate an increased degree of ESD protection. ESD protection tests are currently based on two electrical models known as the "human model" and the "machine model."

The human model is described in MIL Standard 883-C as a 100 picofarad capacitor in series with a 1.5 kiloohm resistor incorporated in an ESD probe. The probe is charged to 1 kilovolt and discharged into each interconnection pad of the MOS device. During discharge, the ESD voltage at the MOS device rises to 1 kilovolt after 10 nanoseconds of discharge and falls to zero volts after 150 nanoseconds of discharge. The 1.5 kilo-ohm resistor limits peak discharge current to 0.67 amperes. To pass the human model ESD test, a MOS device must survive ESD voltage pulses of both positive and negative polarities. Positive ESD pulses cause damage in prior art protection circuits because of contact spiking and gate breakdown.

The machine model (also known as the Japan model) is a 200 picofarad capacitor incorporated in an ESD probe. The probe is charged to 200 volts and discharged into each interconnection pad of the MOS device. During discharge, the ESD voltage at the MOS device rises rapidly to 200 volts and falls to zero volts as a damped oscillation. Peak discharge current can be very high because there is no current-limiting resistor. To pass the machine model ESD test, a MOS device must survive high ESD current pulses of both positive and negative polarities. Such current pulses often cause thermal destruction of features within prior art ESD protection circuits.

Both ESD models present problems for prior art ESD protection circuits. What is needed, therefore, is a low-capacitance ESD protection circuit that is able to protect MOS devices from ESD voltage pulses of both voltage polarities and from the high discharge currents generated by the machine model probe.

SUMMARY OF THE INVENTION

An object of this invention is, therefore, to provide improved ESD protection for MOS integrated circuits.

Another object of this invention is to provide an ESD protection circuit for MOS devices that can withstand ESD voltage and current levels imposed by the human and machine ESD models.

A further object of this invention is to provide protection against ESD pulses of positive and negative polarities.

Still another object of this invention is to provide an ESD protection circuit having reduced capacitance.

The present invention is an ESD protection circuit for a MOS device and uses at least one floating-base N+P−N+ transistor connected between a metal bonding pad and ground. The floating base of each transistor is formed by a thin oxide region deposited over a substrate of the MOS device. Because its N+ regions are formed symmetrically about the floating base, each transistor conducts ESD pulses of both polarities equally. The beta of each transistor is made sufficiently large to withstand short-duration ESD current spikes. Current density is minimized by diffusing a deep N— well into each N+ region of each transistor to provide a larger effective conducting area. Low capacitance and higher breakdown voltage are achieved by eliminating the gate structure of prior art FET-based protection circuits.

Additional objects and advantages of this invention will be apparent from the following detailed description of a preferred embodiment thereof which proceeds with reference to the accompanying drawings.

DETAILED DESCRIPTION OF PREFERRED EMBODIMENT

Figure 1:
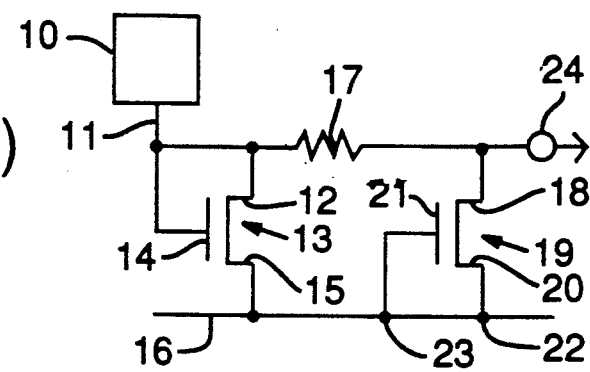
FIG. 1 is an electrical circuit diagram of a prior art ESD protection circuit.
Figure 2:
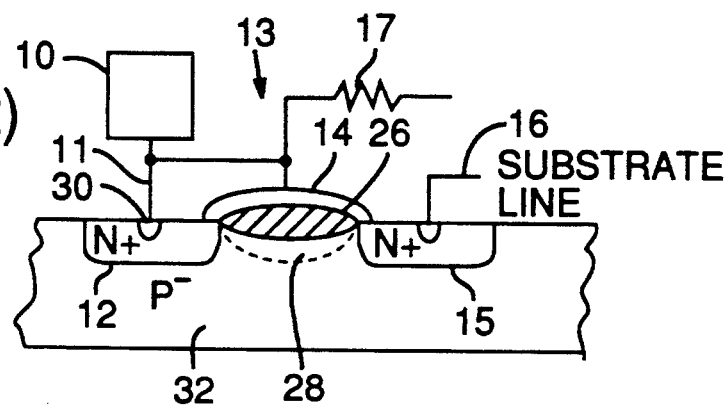
FIG. 2 is an enlarged cross-sectional view of one of the transistors of the prior art circuit of FIG. 1.
Figure 3:
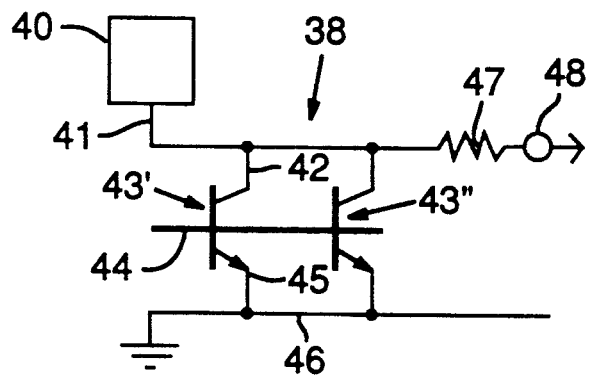
FIG. 3 is an electrical schematic diagram of an ESD protection circuit according to this invention.

With reference to FIG. 3, an ESD protection circuit 38 for a MOS device has a metal bonding pad 40 of similar type to bonding pad 10 of FIG. 1 electrically connected by a metal conductor 41 to a collector 42 of an NPN transistor 43'. NPN transistor 43' has an electrically floating base region 44 and an emitter 45 electrically connected to a "ground line" 46. A second NPN transistor 43" is connected in parallel with transistor 43'. Transistors 43' and 43" (collectively "transistors 43") are substantially the same and together form the basis of ESD protection circuit 38. A 500 ohm resistor 47 provides additional isolation between bonding pad 40 and a metal-to-silicon contact 48 that connects to internal circuits of the MOS device.

Figure 4:
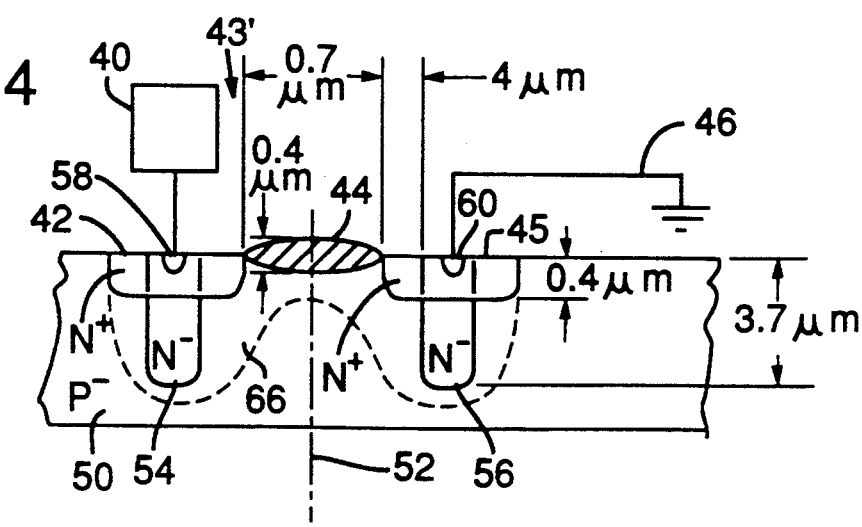
FIG. 4 is an enlarged simplified sectional view taken along lines 4—4 of FIG. 5 of a transistor of the circuit of FIG. 3.

FIG. 4 illustrates a simplified cross-sectional structure of transistor 43'. With reference to FIGS. 3 and 4, the circuit and structure of ESD protection circuit 38 are preferably fabricated using conventional N-channel silicon gate MOS processes. The electrically floating base region 44 of transistor 43' is formed by thermally growing a 0.4 micrometer thick oxide over a substrate 50 of the MOS device. Transistor 43' is of mirror image design symmetrical about a line of symmetry 52 drawn through the center of electrically floating base region 44. Collector 42 and emitter 45 are substantially identical N+ regions diffused to a depth of 0.4 micrometers into substrate 50 at adjacent locations on opposite sides of line of symmetry 52. Collector 42 and emitter 45 have respective 3.7 micrometer deep N— wells 54 and 56 diffused therein. N— wells 54 and 56 are each separated by 4.0 micrometers of N+ material from electrically floating base region 44. Metal bonding pad 40 is electrically connected to collector 42 at a metal contact 58 in N— well 54. Similarly, ground line 46 is electrically connected to emitter 45 at a metal contact 60 in N— well 56. Deep wells 54 and 56 are actually elongated trenches each having multiple contacts 58 and 60. Persons skilled in the art will understand that ground line 46 can be alternatively connected to a reference ground, substrate 50, a power supply voltage (not shown), or any suitable ESD drain potential.

Under normal operating conditions, transistor 43' has a small positive voltage on collector 42 that reverse biases the junction formed between collector 42 and substrate 50 thereby preventing conduction through transistor 43'. Whenever an ESD pulse drives collector 42 positive relative to emitter 45, holes are injected into a depletion region 66 adjacent to electrically floating base region 44. The holes enlarge depletion region 66 causing a forward bias to form across the junction between electrically floating base region 44 and emitter 45. The current flowing across this junction is multiplied by the beta of transistor 43', further enlarging depletion region 66 and ultimately resulting in avalanche breakdown.

If an ESD pulse drives collector 42 negative relative to emitter 45, holes are injected into depletion region 66 by emitter 45, resulting in the same avalanche breakdown sequence as described above. The symmetry of transistor 43' makes it truly bipolar (collector and emitter can be exchanged without altering electrical properties) such that ESD pulses of both polarities are conducted equally. The beta of transistor 43' is made sufficiently large to conduct short-duration ESD current spikes. A preferred beta is realized by making electrically floating base region 0.4 micrometers thick and 0.7 micrometers wide as shown in FIG. 4. Avalanche current density is minimized because N— wells 54 and 56 provide a large conduction area during avalanche breakdown.

Transistors 43 together have a negligible capacitance of about 1-2 picofarads. ESD protection circuit 38 can withstand ESD voltages of ±3 kilovolts and ESD current levels generated by the machine model probe.

Figure 5:
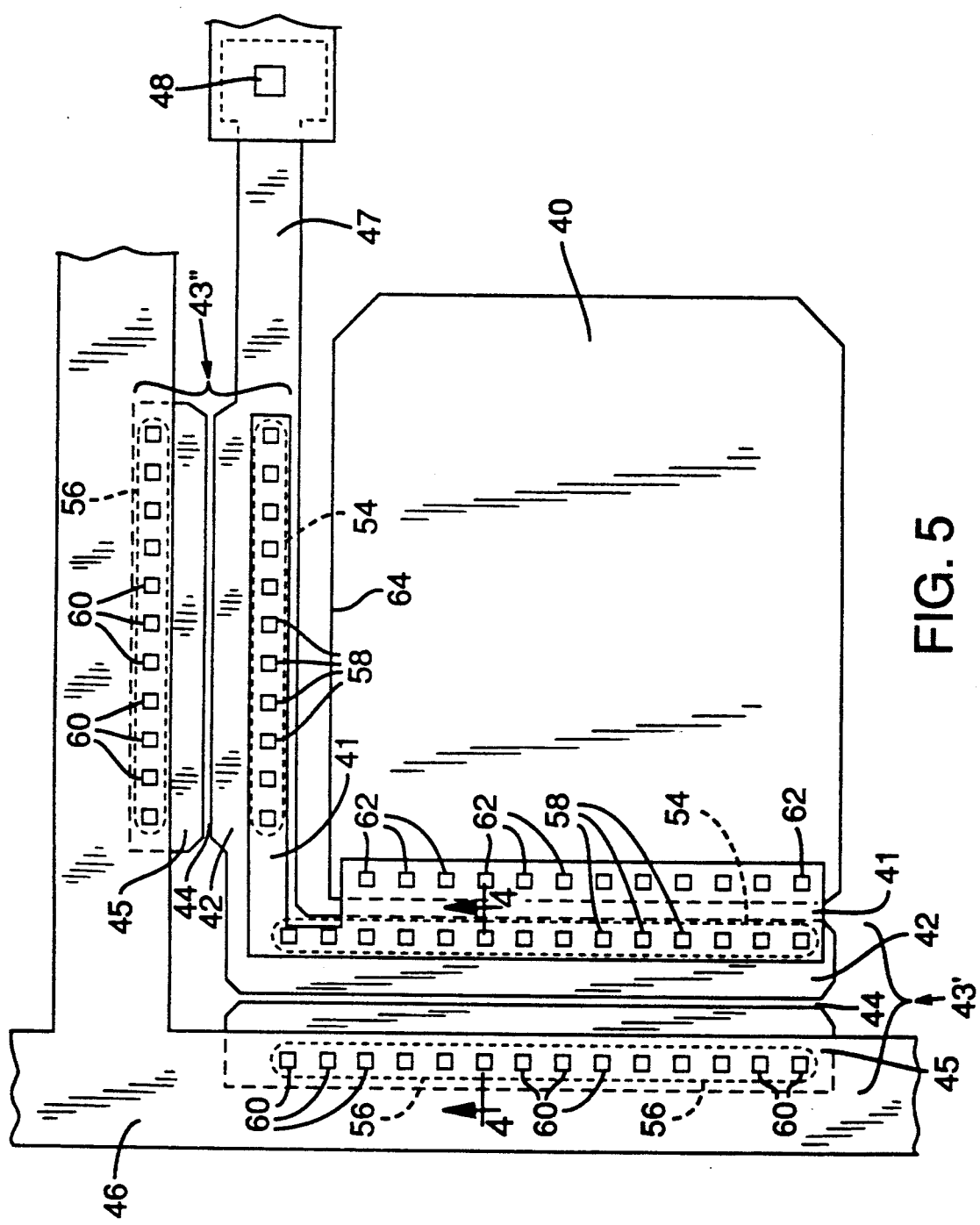
FIG. 5 is an enlarged simplified plan view of an interconnection pad portion of a semiconductor chip having the ESD protection circuit of FIG. 3.

FIG. 5 shows a plan view of ESD protection circuit 38 of FIGS. 3 and 4 as applied to metal bonding pad 40 of a typical MOS device. Typical MOS devices have many such circuits and pads (only one shown) for electrically interconnecting the MOS device with other devices. Metal bonding pad 40 is connected to metal conductor 41 by a set of metal contacts that form a low resistance electrical connection. Metal conductor 41 is electrically connected to collector 42 of NPN transistor 43' at a set of the metal contacts 58. Emitter 45 is electrically connected to ground line 46 at a set of the metal contacts 60. FIG. 5 represents in dashed lines N— wells 54 and 56 because they are formed under metal conductor 41 and ground line 46, respectively. Transistor 43' is thereby formed from elongated emitter and collector regions having multiple contacts that ensure good electrical connection. Electrically floating base region 44 is likewise elongated.

Second NPN transistor 43" is formed and connected in substantially the same manner as that of transistor 43' and is electrically connected in parallel with transistor 43' by metal conductor 41 and ground line 46. The 500 ohm resistor 47 is formed by the resistive properties of N+ material of collector 42 and provides additional isolation between bonding pad 40 and metal-to-silicon contact 48 that connects to internal circuits of the MOS device.

The invention can be equally applied to input, output, tristate, bidirectional, or other terminals of the MOS device. Metal conductor 41 can be fabricated from a resistive material thereby forming an optional isolation resistor between metal bonding pad 40 and collector 42 of transistors 43. Metal conductor 41 can be an integral part of metal bonding pad 40, thereby eliminating the need for metal contacts 60. Transistor 43" may be electrically connected directly to a side margin 64 of metal bonding pad 40. The number and spacing of metal contacts and degree of elongation of transistors 43 are variables that depend on the device fabrication design rules used.

It will be obvious to those having skill in the art that many changes may be made to the details of the above-described embodiment of this invention without departing from the underlying principles thereof. Thus, skilled persons will appreciate the ESD protection circuit may be used in connection with various types and forms of MOS devices. The scope of the present invention should be determined, therefore, only by the following claims.

We claim:

1. An ESD protection structure for a MOS device having a bonding pad and a P− substrate, comprising:
 a symmetrical elongated bi-polar transistor fabricated on and in the P− substrate, the bi-polar transistor comprising an electrically floating elongated base region having a width less than two microns;
 a first N+ semiconductor region formed in the substrate adjacent to a first edge margin of the elongated base region;
 a first N− well having a depth greater than two microns formed in the first N+ semiconductor region;
 a second N+ semiconductor region formed in the substrate adjacent to a second edge margin of the elongated base region;
 a second N− well having a depth greater than two microns formed in the second N+ semiconductor region;
 the first N− well electrically connected to an internal circuit of the MOS device and at a plurality of points to the bonding pad; and
 the second N− well electrically connected at a plurality of points to a ground line,
 whereby, upon receipt of an ESD pulse, the ESD protection structure undergoes an avalanche breakdown that effectively conducts the ESD pulse between the bonding pad and the ground line and away from the internal circuit.

2. The structure of claim 1 in which the ground line is electrically connected to any one of a reference ground, the P− substrate, a power supply voltage, and an ESD drain potential.

3. The structure of claim 1 in which the electrically floating elongated base region comprises a depletion region located in the substrate and under a field oxide grown on the substrate.

4. The structure of claim 1 in which the base region width is less than about one micron.

5. The structure of claim 1 in which the first and second N+ regions each have a width greater than about four microns.

6. The structure of claim 1 in which the depth of the first and second N− wells is greater than about three microns.

7. The structure of claim 1 in which the first N+ semiconductor region functions as a collector and the second N+ semiconductor region functions as an emitter of the symmetrical elongated bi-polar transistor.

8. The structure of claim 1 in which the first and second N− wells each form N− trenches in the P− substrate, and in which the plurality of electrical connection points on each of the N− wells are formed by a linearly distributed set of metal contacts deposited on an elongated surface of each of the N− wells.

9. The structure of claim 1 in which the ESD pulse conforms to one of a human model and a machine model of an electrical discharge pulse.

10. The structure of claim 3 in which the field oxide has a thickness of about 0.4 microns.

* * * * *